United States Patent [19]

Stephens et al.

[11] Patent Number: 5,284,825
[45] Date of Patent: Feb. 8, 1994

[54] CONTAMINANT DIFFUSION BARRIER FOR A CERAMIC OXIDE SUPERCONDUCTOR COATING ON A SUBSTRATE

[75] Inventors: Richard B. Stephens, Del Mar; Frederick H. Elsner, Carlsbad, both of Calif.

[73] Assignee: General Atomics, San Diego, Calif.

[21] Appl. No.: 901,546

[22] Filed: Aug. 17, 1992

Related U.S. Application Data

[60] Division of Ser. No. 724,764, Jul. 2, 1991, abandoned, which is a continuation-in-part of Ser. No. 523,221, May 14, 1990, Pat. No. 5,149,681.

[51] Int. Cl.$^5$ .......................... B05D 3/02; B05D 5/12
[52] U.S. Cl. ......................................... 505/1; 505/733; 505/730; 427/62; 427/376.1; 427/376.2; 427/419.3
[58] Field of Search ................ 505/1, 733, 730; 427/62, 63, 375, 376.1, 376.2, 419.3, 419.2

[56] References Cited

U.S. PATENT DOCUMENTS

| | | | |
|---|---|---|---|
| 4,931,424 | 6/1990 | Henty | 505/1 |
| 4,948,779 | 8/1990 | Keur et al. | 505/1 |
| 4,966,142 | 10/1990 | Zimmerman et al. | 228/263.12 |
| 4,988,672 | 1/1991 | Severin et al. | 505/1 |

FOREIGN PATENT DOCUMENTS 1-318269  12/1989  Japan .

OTHER PUBLICATIONS

Gai, P. L., et al. "Synthesis, Microstructure and Local Chemistry of Superconducting BiSrCaCuO Thin Films." Mat. Res. Soc. Symp. Proc. vol. 138, 1989, pp. 143–149.

Simon, R. W. et al. "Low-Loss Substrate for Epitaxial Growth of High-Temperature Superconductor Thin Films", Applied Physics Letters. American Institute of Physics. vol. 53, No. 26, Dec. 26, 1988, pp. 2677–2679.

*Primary Examiner*—Roy King
*Attorney, Agent, or Firm*—Nydegger & Associates

[57] ABSTRACT

A superconducting structure is provided comprising a substrate, a superconductor coating supported by the substrate and a diffusion barrier positioned between the superconductor coating and the substrate to inhibit diffusion of contaminants from the substrate to the superconductor coating. The coating is a ceramic oxide having superconducting properties. The diffusion barrier may likewise be a ceramic oxide, but differs in its specific composition to provide it with a peritectic decomposition temperature greater than the superconductor coating. Accordingly, the diffusion barrier exhibits substantially lower atomic mobility than the superconductor coating during manufacture of the superconducting structure, thereby preventing contamination of the coating by the substrate.

11 Claims, 1 Drawing Sheet

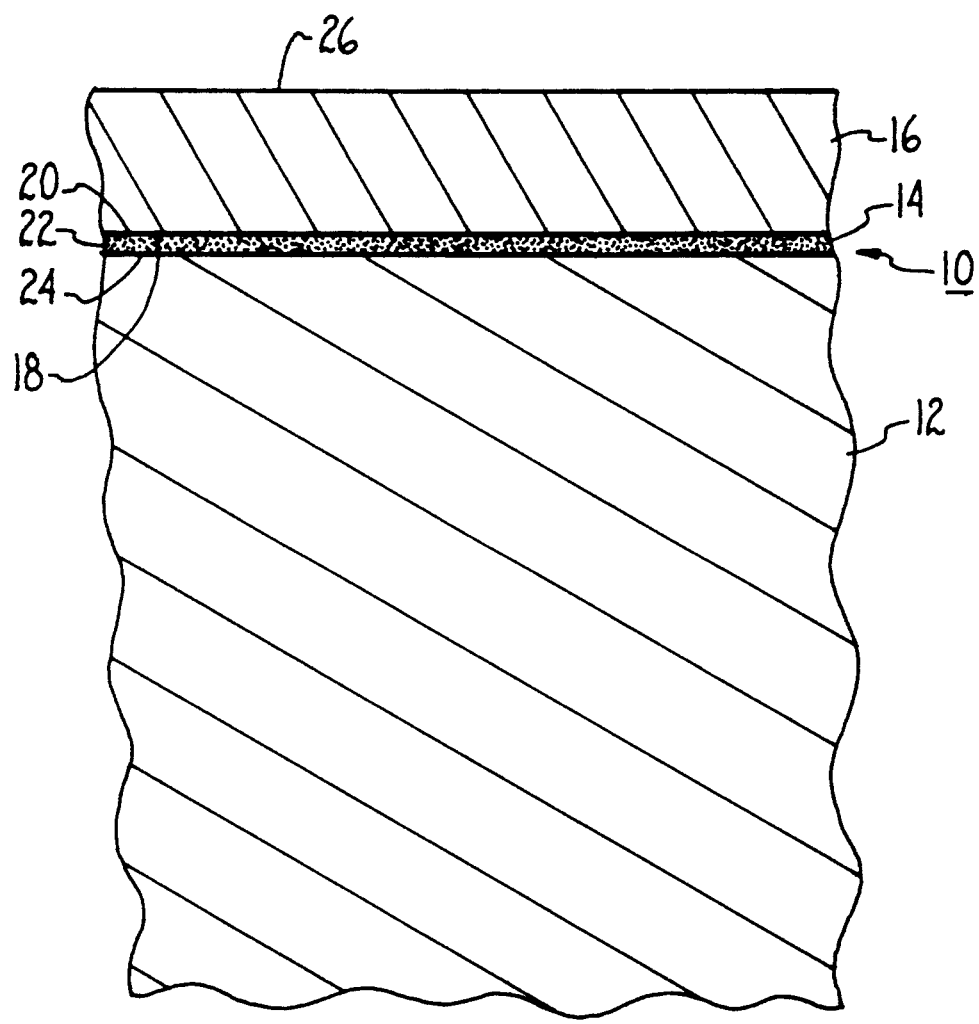
Figure

CONTAMINANT DIFFUSION BARRIER FOR A CERAMIC OXIDE SUPERCONDUCTOR COATING ON A SUBSTRATE

This application is a division of application Ser. No. 07/724,764, filed Jul. 2, 1991, now abandoned, which is a continuation-in-part of prior copending application for "Melt Texturing of Long Superconductor Fibers," Ser. No. 523,221, filed May 14, 1990 now U.S. Pat. No. 5,149,681.

FIELD OF THE INVENTION

The present invention relates generally to superconductors and, more specifically, to a superconductor coating on a substrate.

BACKGROUND OF THE INVENTION

Superconductivity is the property whereby certain materials have the ability to lose both electrical resistance and magnetic permeability at extremely low temperatures. The commercial feasibility of a given superconducting material is to a large extent dependent on its critical temperature ($T_c$), i.e., the temperature below which the material performs as a superconductor. Superconducting materials are presently known having a $T_c$ as high as 125K. Among known superconducting materials is the family of ceramic oxides having a perovskite crystal structure and the general formula $R_1Ba_2Cu_3O_{7-x}$, where R is a rare earth metal and x is between about 1 and 0. The rare earth metals are defined as the lanthanide elements 57 to 71, scandium, and yttrium. Compounds having the above-recited formula are colloquially known as "1-2-3" compounds because of the approximate ratio of R to barium to copper. Among other known ceramic oxide families which have superconducting properties are those based on compounds of Bi-Sr-Ca-Cu-O and Tl-Sr-Ca-Cu-O, each of which may have several phases.

Superconductors are commonly utilized as coatings on metallic substrates which act as a support for the superconductor. There are many different methods for depositing the superconductor coating on the substrate including powder deposition, high and low pressure vapor deposition, and liquid deposition methods. Exemplary vapor deposition methods are sputtering, thermal evaporation, laser ablation and chemical vapor deposition. Exemplary liquid deposition methods are sol-gel techniques using metal organic compounds.

All of the above-recited deposition methods commonly follow the same basic procedure of distributing the superconducting material over the substrate and heating the material to a temperature which effects a high level of atomic mobility in the material. This procedure may be performed in separate sequential steps or it may be performed simultaneously in a single step. In any case, when a high level of atomic mobility is achieved in the superconducting material, proper grain growth is stimulated within the material which imparts the desired superconducting properties thereto.

By way of illustration, a powder deposition method is performed by first distributing the powder onto the substrate in a porous undensified state. An elevated level of atomic mobility is then achieved in the powder coating by rapidly sintering the coating at as high a temperature as possible which does not substantially melt the powder, thereby avoiding formation of phases which would interfere with the superconductivity properties of the coating. Sintering of the powder stimulates grain growth and produces a densified coating which adheres to the substrate and desirably possesses superconducting properties.

Sintering, however, can also detrimentally result in contamination of the coating by the substrate which ultimately diminishes the superconducting properties of the coating. The high atomic mobility of the powder exhibited during sintering enables diffusion of contaminants into the superconductor from the substrate, particularly if any liquid phase is present. Even trace levels of such contaminants in the superconductor can decrease the critical temperature of the superconductor, thereby substantially diminishing the effectiveness thereof.

Substrate contamination of the superconductor coating is a problem with virtually all known superconductor deposition methods, wherein high atomic mobility is required to achieve proper grain growth. As described above, such methods include powder, vapor, and liquid deposition methods. Accordingly, the objects of the present invention set forth below, and the description provided thereafter, apply to coated superconductor structures produced by these known deposition methods generally.

It is therefore an object of the present invention to inhibit the contamination of a superconductor coating by a substrate supporting the same. More specifically, it is an object of the present invention to provide a diffusion barrier between a superconductor coating and a substrate supporting the same, thereby inhibiting diffusion of contaminants into the superconductor from the substrate, particularly during deposition of the superconductor coating onto the substrate when the coating exhibits a high level of atomic mobility. It is another object of the present invention to provide an effective diffusion barrier which does not react with the superconductor to form non-superconducting phases. Finally, it is an object of the present invention to provide a diffusion barrier which further serves as a parting layer, thereby enabling support of a superconductor coating by a substrate having a different coefficient of thermal expansion than the superconductor coating.

SUMMARY OF THE INVENTION

The present invention is a superconducting structure comprising a substrate, a superconductor coating supported by the substrate and a diffusion barrier positioned between the superconductor coating and the substrate. The superconductor coating is substantially any ceramic oxide material exhibiting superconducting properties. The diffusion barrier is a ceramic oxide which has a peritectic decomposition temperature, i.e., melting onset temperature, greater than that of the superconductor coating. The superconductor coating and diffusion barrier are further distinguishable in that the superconductor coating has an atomic mobility substantially greater than that of the diffusion barrier during deposition processing of the coating, wherein the coating undergoes grain growth to acquire superconducting properties. In the specific case of a powder deposition method, the superconductor coating and diffusion barrier are distinguishable in that the ultimate porosity of the diffusion barrier is substantially greater than that of the superconductor coating because densification of the coating results from grain growth.

The present invention is also a method for making the above-described superconducting structure. The method is initiated by selecting two distinct porous ceramic oxide compositions, such that the compositions have different peritectic decomposition temperatures. The first composition having the higher peritectic decomposition temperature is employed as the diffusion barrier and the second composition having the lower peritectic decomposition temperature is employed as the superconductor coating.

A substrate is coated with the first composition, and the coated substrate is in turn coated with the second composition. Simultaneous with distribution of the coatings over the substrate or subsequent thereto, the substrate and coatings are heated to a mobilizing temperature which induces a higher atomic mobility in the second composition than the first composition, thereby producing sufficient grain growth in the second composition to impart superconducting properties thereto. The mobilizing temperature is, nevertheless, maintained below the peritectic decomposition temperature of the first composition such that the first composition does not achieve sufficient atomic mobility to enable substantial diffusion of contaminants into the second composition from the substrate. The second composition consequently forms a superconductor layer over the substrate, while the first composition acts as a diffusion barrier between the substrate and the superconductor coating.

Since the lack of atomic mobility in the first composition inhibits diffusion of contaminants from the substrate to the superconductor coating, the effectiveness of the superconductor coating is thereby maintained after deposition onto the substrate. The first composition further acts as a parting layer between the superconductor coating and the substrate, enabling one to employ a superconductor coating and a substrate in combination which do not have identical coefficients of thermal expansion. Thus, the present invention allows the practitioner greater choice in the selection of substrates to be used with superconductor coatings.

The novel features of this invention, as well as the invention itself, both as to its structure and its operation, will be best understood from the accompanying drawings, taken in conjunction with the accompanying description, in which similar reference characters refer to similar parts, and in which:

BRIEF DESCRIPTION OF THE DRAWING

The figure shows a cross-section of the layered superconducting structure of the present invention.

DETAILED DESCRIPTION OF PREFERRED EMBODIMENTS

The figure shows a magnified cross-section of the superconducting structure of the present invention. The structure is designated generally as 10 and comprises a substrate 12, a first layer 14 which is the contaminant diffusion barrier, and a second layer 16 which is the superconductor coating. Substrate 12 is a support for superconductor coating 16 and diffusion barrier 14 is an interface between superconductor coating 16 and substrate 12.

For purposes of illustration, structure 10 is shown as the product of a powder deposition method, wherein first layer 14 is characterized as porous while second layer 16 is characterized as densified. First layer 14 has a larger proportion of its volume occupied by void spaces than second layer 16, such that first layer 14 preferably has at least about 10% of its volume occupied by void spaces. As will be appreciated by one skilled in the art, however, where structure 10 is the product of other known deposition methods within the scope of the present invention, such as vapor or liquid deposition methods, first layer 14 and second layer 16 may both be in a densified state during and after processing of layers 14 and 16 is completed.

Substrate 12 is a substantially impermeable and homogeneous composition which has sufficient strength and rigidity to support layers 14 and 16 positioned thereon, and which is relatively inert during processing of layers 14 and 16. Among the compositions satisfying these criteria are metals, such as nickel, aluminum, or alloys thereof. For reasons shown hereafter, it is not essential that substrate 12 and superconductor 16 have the same coefficient of thermal expansion, as is required of conventional superconducting structures. Thus, differences in the coefficients of thermal expansion as great as $3 \times 10^{-6} K - 1$ or more may be tolerated in the present invention. Any number of geometries are possible for substrate 12, including, most commonly, a flat planar geometry or a cylindrical geometry in the form of a wire. It is apparent that layers 14 and 16 are capable of conforming to substantially any geometry of substrate 12.

The top surface 18 of layer 14 abuts the bottom surface 20 of layer 16 and the bottom surface 22 of layer 14 abuts the top surface 24 of substrate 12. In this manner, layer 14 substantially prevents contact between layer 16 and substrate 12. Layer 14 is preferably very thin relative to layer 16. More preferably, layer 14 is as thin as is practically possible to place it on substrate surface 24 without allowing contact between surface 20 of layer 16 and substrate surface 24. Thus, layer 14 has a thickness between about 10 and 50 microns, and preferably between about 10 and 20 microns. In contrast, layer 16 has a thickness between about 10 and 2000 microns, and preferably between about 200 and 300 microns.

Layer 14 may be substantially any known ceramic oxide superconducting material. A preferred superconducting material has the general formula $R_1Ba_2Cu_3O_{7-x}$, wherein R is a rare earth element and x is between about 1 and 0. Layer 14 substantially inhibits contamination of layer 16 from substrate 12 by diffusion across layer 14. Elements whose introduction into layer 16 could degrade its superconducting properties include Ni, Al, Si, Ti, B and Fe.

The bottom surface 20 of layer 16 abuts the top surface 18 of layer 14 and the top surface 26 of layer 16 is exposed to the surrounding superconductor environment. As the superconductor coating, layer 16 is substantially thicker than layer 14. Layer 16 is a ceramic oxide composition and preferably is a ceramic oxide superconducting material. Where layer 16 is a preferred $R_1Ba_2Cu_3O_{7-x}$ superconducting material, layer 14 is likewise a superconducting material having the same general formula as layer 16. However, the compositions of layers 14 and 16 differ in values of either one or both of the R and x variables. Importantly, the composition of layer 16 differs from that of layer 14 such that the melting onset temperature of layer 16 is less than that of layer 14. Melting onset temperature is defined herein as the peritectic decomposition temperature of a material.

It is understood that both layers 14 and 16 may have compositions which exhibit superconducting characteristics. The descriptors "diffusion barrier" and "superconductor," which are used herein to identify layers 14 and 16 respectively, simply refer to the function of each layer in the final superconducting structure and are not to be construed as otherwise limiting the compositions of the layers.

To illustrate this point, two such compositions are compared. $DyBa_2Cu_3O_7$ has a peritectic temperature of about 1035° C. while $NdBa_2Cu_3O_7$ has a peritectic temperature of about 1108° C. Although both compositions have the same general formula, the difference in the value of R between the two compositions accounts for the difference in the peritectic decomposition temperatures of the two compositions. Thus, if one were selecting two compositions in accordance with the present invention, $NdBa_2Cu_3O_7$ would make up layer 14, while $DyBa_2Cu_3O_7$ would make up layer 16. Similar such comparisons could be performed between other ceramic oxides to select suitable materials for use in the present invention.

Diffusion barrier 14 is most effective when the peritectic decomposition temperature difference between the compositions of layers 14 and 16 is at least about 20° C., preferably about 50° C., and most preferably about 100° C. Where layers 14 and 16 are the result of a powder deposition method, the composition of layer 14 is preferably selected such that its peritectic decomposition temperature is greater than the optimal sintering temperature of layer 16. Since the optimal sintering temperature for a superconducting material having the present general formula is on the order of at least about 1000° C., the composition of layer 14 is selected having a peritectic decomposition temperature of at least about 1020° C., preferably at least about 1050° C., and most preferably about 1100° C. By comparison, the composition of layer 16 is selected having a peritectic decomposition temperature of less than about 1080° C., preferably less than about 1050° C., and most preferably about 1000° C. The above-recited temperatures relate to operation in one atmosphere of oxygen pressure. As is apparent to one skilled in the art, if operation is performed at lower oxygen pressures, the temperature ranges will be correspondingly reduced.

The present invention further comprises a method for inhibiting contamination of a ceramic oxide superconductor coating by a substrate supporting the coating. The method is initiated by selecting a substrate, a first ceramic oxide composition and a second ceramic oxide composition according to the above-recited criteria. Specifically, the first ceramic oxide composition is selected having a higher peritectic decomposition temperature than the peritectic decomposition temperature of the second ceramic oxide composition. The compositions may typically be in the form of an undensified, i.e. porous, powder, as well as other forms such as gels, aerosols, vapors and the like.

Using any known deposition method, e.g., powder deposition as shown in the figure, substrate 12 is thinly coated with the first composition to form inner layer 14. Thereafter, inner layer 14 is coated more thickly with the second composition to form outer layer 16 without substantially disturbing inner layer 14. Layers 14 and 16 are heated subsequent to, or simultaneous with, distribution over substrate 12 to a mobilizing temperature which substantially increases the atomic mobility of layer 16 to a level greater than that of layer 14. Whether layer 16 achieves a higher level of atomic mobility than layer 14 during heating is determined by measuring the concentration of substrate constituents in layer 16 after completion of the deposition procedure. If the concentration of substrate constituents in layer 16 is nil or negligible, a higher level of atomic mobility in layer 16 is ascertained to have been achieved. Conversely, if significant substrate constituents are found in layer 16, a higher level has not been achieved.

Where layers 14 and 16 are powders, the mobilizing temperature is preferably the optimal sintering temperature of layer 16. Substrate 12 may be optionally cooled relative to layer 16 prior to, or during, heating to reduce the reactivity of substrate 12 and the degree of sintering of layer 14 adjacent thereto. This enables the use of compositions in layers 14 and 16 having peritectic temperatures closer than would otherwise be tolerable. After the heating step, second layer 16 may undergo an oxygen anneal in a temperature range of about 400° C. to 500° C. for between about 24 to 48 hours. Layer 16 is subsequently cooled to provide a densified superconductor coating over substrate 12. Although layer 16 has been densified at the sintering temperature, layer 14 is at most only weakly sintered. Thus, layer 14 is in a porous form between layer 16 and substrate 12.

In addition to its role as a diffusion barrier, layer 14 further functions as a parting layer. Particularly where layer 14 is the result of a powder deposition method, it does not strongly adhere to substrate surface 24 in its porous state. Thus, if substrate 12 thermally expands at a different rate than layer 16, the superconductor coating may avoid damage because it is not tightly bound to substrate 12 by reason of intervening layer 14.

The following example provides further details of preferred embodiments of the present invention. However, the example is not to be construed as limiting the scope of the invention. Parts and percentages are by weight, unless otherwise indicated.

EXAMPLE

A Ni(95)Al(5) wire having a diameter of 76 microns is selected as a substrate. The wire has a thermal expansion coefficient of $13 \times 10^{-6} K^{-1}$. The wire is coated with $NdBa_2Cu_3O_{7-x}$ powder to a thickness of 10 microns. The coating has a peritectic decomposition temperature of 1108° C. A second coating of $DyBa_2Cu_3O_{7-x}$ powder is placed over the first coating without disturbing it. The thickness of the second coating is 300 microns. The second coating has a peritectic decomposition temperature of 1035° C. The coated wire is then heated to the optimal sintering temperature of the second coating, 1040° C., for about 15 seconds. The coating then undergoes an oxygen anneal of 450° C. for 36 hours. At the end of this time the sintered second coating is an effective superconductor having a $T_c$ of 93K and a $J_c$ measured at 50K of $8 \times 10^3 A/cm^2$. The thermal expansion coefficient of the second coating is $14 \times 10^{-6} K^{-1}$, however, no damage to the coating after sintering is observed. The first coating is essentially unaffected by the processing required to sinter the second coating, and retains its porous state after sintering, effectively functioning as a contaminant diffusion barrier and a parting layer. The second coating remains substantially free of nickel and aluminum constituents from the substrate.

To confirm the effectiveness of the first coating as a diffusion barrier, a control experiment is performed. In the control experiment, the powder of the second coating is sintered onto the substrate under the same conditions as the example, but in the absence of the first coating. The resulting second coating has a $T_c$ of 90K and a $J_c$ measured at 50K of $4 \times 10^3 A/cm^2$.

It is apparent that the barrier of the present invention prevents substantial diminution of the properties of the superconductor coating when deposited onto a substrate which would otherwise occur in the absence of the barrier.

While a particular CONTAMINANT DIFFUSION BARRIER FOR A CERAMIC OXIDE SUPERCONDUCTOR COATING ON A SUBSTRATE as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

We claim:

1. A method for inhibiting contamination of a ceramic oxide superconductor by a substrate supporting said superconductor, the method comprising:

coating the substrate with an inner layer of a first ceramic oxide composition;

coating said first ceramic oxide composition with an outer layer of a second ceramic oxide composition; and heating said second ceramic oxide composition to its peritectic decomposition temperature, which transforms said second ceramic oxide composition to said ceramic oxide superconductor, wherein said first ceramic oxide composition remains essentially unchanged, said inner layer thereby providing a diffusion barrier to substantially inhibit contamination of said ceramic oxide superconductor by said substrate.

2. The method as recited in claim 1 wherein said first ceramic oxide composition has a peritectic decomposition temperature greater than that of said second ceramic oxide composition.

3. The method as recited in claim 2 wherein said first and second compositions are in powdered porous state prior to said heating step.

4. The method as recited in claim 3 wherein said ceramic oxide superconductor has less than about 10% of its volume occupied by void spaces, and said diffusion barrier has at least about 10% of its volume occupied by void spaces.

5. The method as recited in claim 3 wherein said outer layer is sintered at a sintering temperature at least about 20 centigrade degrees below the peritectic decomposition temperature of said inner layer.

6. The method as recited in claim 3 wherein said outer layer is sintered at a sintering temperature between about 1000° and 1080° C.

7. The method as recited in claim 2 wherein the peritectic decomposition temperature of said first ceramic oxide composition is between about 20° and 100° C. greater than the peritectic decomposition temperature of said second ceramic oxide composition.

8. The method as recited in claim 1 wherein said outer layer has a thickness between 1 and 40 times as great as that of the inner layer.

9. The method as recited in claim 1 wherein said first ceramic oxide composition and said second ceramic oxide composition have the general formula $R_1Ba_2Cu_3O_{7-x}$, wherein R is a rare earth element and x is between about 1 and 0, further wherein R in said first ceramic oxide composition and R in said second ceramic oxide composition are different.

10. The method as recited in claim 1 wherein the thermal expansion coefficient of said substrate differs from the thermal expansion coefficient of said ceramic oxide superconductor by an amount up to $3 \times 10^{-6} K^{-1}$.

11. The method as recited in claim 1 wherein said inner layer is a parting layer between said outer layer and said substrate.

* * * * *